United States Patent [19]

Triebwasser

[11] 4,222,164

[45] Sep. 16, 1980

[54] METHOD OF FABRICATION OF SELF-ALIGNED METAL-SEMICONDUCTOR FIELD EFFECT TRANSISTORS

[75] Inventor: Sol Triebwasser, Peekskill, N.Y.

[73] Assignee: International Business Machines Corporation, Armonk, N.Y.

[21] Appl. No.: 974,592

[22] Filed: Dec. 29, 1978

[51] Int. Cl.² ............................................. B01J 17/00
[52] U.S. Cl. ....................................... 29/571; 29/578; 29/579; 357/15; 357/23; 357/59
[58] Field of Search ......................... 29/571, 578, 579; 357/15, 23, 59

[56] References Cited

U.S. PATENT DOCUMENTS

| | | | |
|---|---|---|---|
| 3,574,010 | 4/1971 | Brown | 29/571 |
| 3,609,477 | 9/1971 | Drangeid | 357/15 |
| 3,756,924 | 9/1973 | Collins | 204/15 |
| 3,763,408 | 10/1973 | Kano | 357/15 |
| 3,855,690 | 12/1974 | Kim | 29/571 |
| 3,906,541 | 9/1975 | Goronkin | 357/22 |
| 3,909,925 | 10/1975 | Forbes | 29/578 |
| 3,943,622 | 3/1976 | Kim | 29/579 |
| 4,029,522 | 6/1977 | De La Moneda | 148/1.5 |

OTHER PUBLICATIONS

IBM Tech. Bulletin, "FET Utilizing Schottky Barrier Principle," by Ames, vol. 9, No. 10, Mar. 1967, pp. 1470–1471.
IBM Tech. Bulletin, "Process for Obtaining . . . Lift-off," by Canavello, vol. 19, No. 10, Mar. 1977, p. 4048.

Primary Examiner—W. C. Tupman
Attorney, Agent, or Firm—Michael J. Weins

[57] ABSTRACT

A method for the production of metal-semiconductor field effect transistors (MESFET) is described. Practice of the method allows one to produce self-aligning MESFETs with Si sources and drains in close proximity having metal gates therebetween.

8 Claims, 9 Drawing Figures

METHOD OF FABRICATION OF SELF-ALIGNED METAL-SEMICONDUCTOR FIELD EFFECT TRANSISTORS

DESCRIPTION

1. Technical Field

This invention relates to a method for the fabrication of a field effect transistor (FET), and in particular to a method for the production of metal-semiconductor field effect transistors (MESFET).

2. Background Art

The early MESFET structures described by the prior art had relatively large gate to drain distances, and gate to source distances. In general, the separation between the source and the gate, the gate and the drain, were the same order of magnitude as the width of the gate. Hence, the minimum allowed source to drain distance was approximately three times the minimum gate width. Since only the region under the gate is electrically controlled, two thirds of the channel offered parasitic resistance. The problem of parasitic resistance was appreciated by Drangeid in U.S. Pat. No. 3,609,477. His solution to the problem was to substitute highly conductive materials in the parasitic region and thereby reduce parasitic resistance. It was subsequently appreciated by Kim et al, U.S. Pat. No. 3,855,690 and 3,943,622 that the parasitic resistance could be reduced by growing faceted source and drain regions, frequently referred to as mesas. These mesas were spaced apart, the facets having overgrown edge portions. The faceted sources and drains were employed as masks for deposition of a Schottky barrier gate. The overgrowth portion provide shielding of the surface in the immediate vicinity of the source and the drain, thereby preventing shorting between the source and gate. While the Kim et al patents offered a partial solution to the problem of the parasitic resistance their solution was not totally satisfactory. First, it required the device to have a complex geometry, and required epitaxial attachment of the sources and drains to the substrate. Second, one had to assure overgrown portions were faceted. This limited the possible substrate orientations onto which the epitaxially attached faceted mesas could be grown. The preferred surface for epitaxial growth being the (001) plane of the semiconductor crystal. Another shortcoming of the Kim et al procedure was that it failed to provide insulating material between either the source and the gate, or the drain and the gate, thereby limiting the separation that could be obtained without leakage between the gate, and the source and drain. Goronkin's U.S. Pat. No. 3,906,541 describes another technique using mesas that are epitaxially grown onto a substrate. These mesas again serve as masks for subsequent steps. This technique is subject to the same shortcomings as are the earlier patents of Kim et al.

Forbes et al in U.S. Pat. No. 3,909,925 discloses and claims a method for interposed spaced polysilicon gates and aluminum gates. However, his technique teaches totally encasing the polysilicon gates with silicon dioxide, and results in structures in which polysilicon gates and aluminum gates are isolated from the substrate. The method of Forbes et al is not applicable to the fabrication of MESFETs.

DISCLOSURE OF INVENTION

It is an object of the invention to provide self aligned MESFET with reduced series resistance.

Another object of the invention is to provide for isolation of the source, drain and gate in a MESFET by providing an insulator therebetween.

A further object of this invention is to provide silicon sources and drains in a MESFET which are attached to the conductive substrate.

Still a further object of this invention is to provide a MESFET device of minumum area.

These and other objects of this invention will become apparent from studying the fabrication technique for a self-aligned Schottky barrier field effect transistor (MESFET) as herein described. A MESFET is made by depositing on a semiconductor body an epitaxial layer of opposite polarity. A layer of $SiO_2$ is deposited onto the epitaxial layer and onto the $SiO_2$ layer is deposited a layer of $Si_3N_4$. A photoresist material is overlayed on the $Si_3N_4$ layer, exposed, and developed to provide patterned openings therein and exposing regions of the $Si_3N_4$. Etching is employed to remove the exposed $Si_3N_4$ and the etching continued through the underlying $SiO_2$ so as to expose regions of the epitaxial deposited layer. Doped Si is deposited onto the exposed regions of the epitaxial silicon. The unexposed photoresist is lifted leaving doped Si mesas for sources and drains, with substrate areas therebetween being reserved for subsequent deposition of gates.

A second application of photoresist is applied to the $Si_3N_4$ and the Si mesas. The photoresist is exposed and developed except for the area reserved for a metal gate. The $Si_3N_4$ areas exposed by the development process are removed by etching, and subsequently the photoresist is removed from the gate areas. The Si mesas are oxidized. Finally, $Si_3N_4$ is etched away, as well as, the underlying $SiO_2$ layer. A metal gate is patterned onto the exposed epitaxial layer using standard photoresist processes. Subsequently, a suitable metallurgy can be evaporated and patterned to form source, drain, the Schottky gate contacts and interconnectors.

BEST MODE FOR CARRYING OUT THE INVENTION

Figure 1:
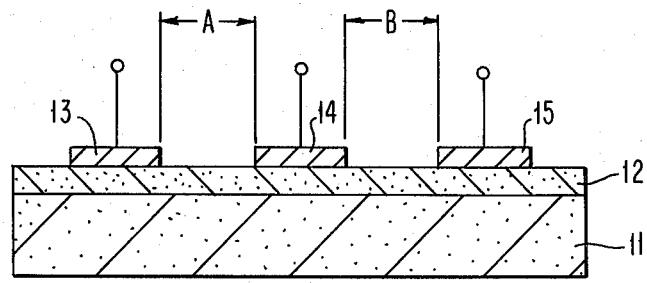
FIG. 1 is a cross-sectional view of a prior art Schottky barrier field effect transistor.

FIG. 1 is a pictorial representation of a prior art MESFET. A semiconductor body 11 has deposited thereon an epitaxial layer 12 of opposite polarity to the semiconductor body 11. On the surface of the epitaxial layer 12 are deposited a source 13, a gate 14, and a drain 15. The source 13, gate 14, and drain 15 are defined by standard lithographic techniques which results in a gap A between the gate 14 and the source 13, and a gap B between the gate 14 and the drain 15. The dimension of the gaps are of the same order of magnitude as the width of the gate 14. The gaps A and B contribute to the parasitic resistance of the device, and provide lower limits as to the size of the resulting MESFET.

Figure 2:
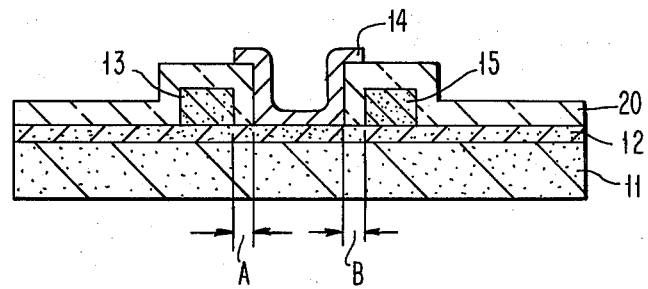
FIG. 2 is a cross-sectional view of a Schottky barrier field effect transistor made in accordance with the method of the present invention.

FIG. 2 shows a MESFET made by the method of the present invention. When the method of the present invention is practiced it is possible to reduce the gap A between the source 13 and the gate 14, and the gap B between the gate 14 and the drain 15 to the thickness of an oxide layer 20.

FIG. 3 illustrates various steps in the production of the MESFET according to the method of the present invention. Referring to FIG. 3A, a MESFET is produced on a semiconductor body 11 by first growing an epitaxial layer 12 of opposite polarity. If for example an n type expitaxial layer 12 is grown on the semiconductor body it should be between 1000Å to 10,000Å and be doped with As or P to a level of $10^{15}$ to $10^{16}$ donors per cm$^3$, the exact choices depending on whether enhancement or depletion behavior is desired. On the epitaxial layer 12 is deposited a silicon dioxide layer 22 having a thickness of about 100 Å to 1000 Å. The lower limit assures that there will be sufficient padding to avoid strain damage to the underlying structure during subsequent deposition steps. Preferrably the thickness of the SiO$_2$ layer should be about 250 Å. Onto the SiO$_2$ layer 22 is deposited a Si$_3$N$_4$ layer 24. The Si$_3$N$_4$ layer 24 is between about 200 Å to 1000 Å and preferrably about 500 Å. When the Si$_3$N$_4$ layer 24 is less than about 200 Å it does not provide a sufficient shielding of the underlying structure to prevent further oxidation. Onto the Si$_3$N$_4$ layer 24 is applied a first photoresist layer 26. The thickness of the photoresist layer being between about 5000 Å to 10,000 Å.

Figure 3A:
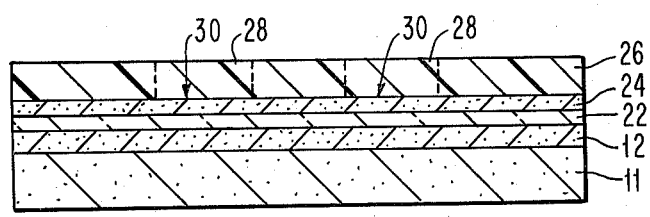
FIGS. 3a through g are cross-sectional views of a portion of a Schottky barrier field effect transistor such as shown in FIG. 2, illustrating steps in the fabrication of the device in accordance with the method of the present invention.
Figure 3B:
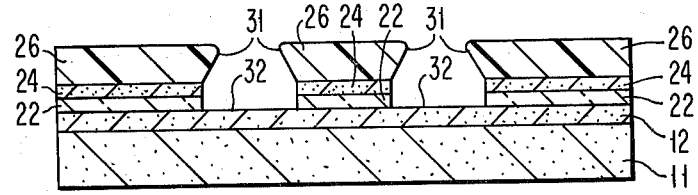

The photoresist layer 26 is selectively exposed and developed to provide patterned openings 28 which in turn expose regions 30 of the silicon nitride layer 24. Preferrably the exposure and development technique should provide and undercut profile 31 as illustrated in FIG. 3B. One method for developing an undercut profile is described in an article "Process for Obtaining Undercutting of a Photoresist to Facilitate Lift Off", by B. J. Carvanello, M. Hatzakis and J. M. Shaw, IBM Technical Disclosure Bulletin, Vol. 19, No. 10, p. 4048 (March 1977). The exposed regions 30 of the Si$_3$N$_4$ layer 24 are etched by wet chemistry employing a solution of H$_3$PO$_4$ which is heated to 180° C., or by reactive ions wherein the reactive ions are generated from the mixture of CF$_4$ and 30% H$_2$. The latter etching procedure is preferred. The etching is continued until the silicon nitride has been removed from the regions 30, as well as the SiO$_2$ layer 22. This exposes regions 32 of the epitaxial layer 12 as illustrated in FIG. 3B.

Figure 3C:
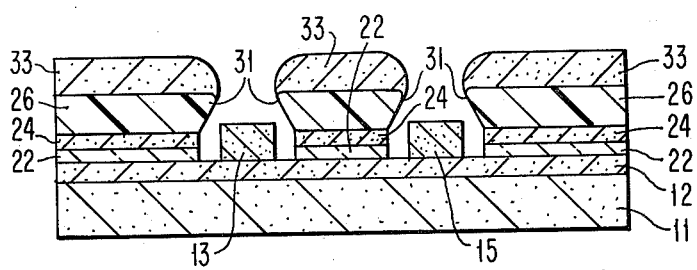
Figure 3D:
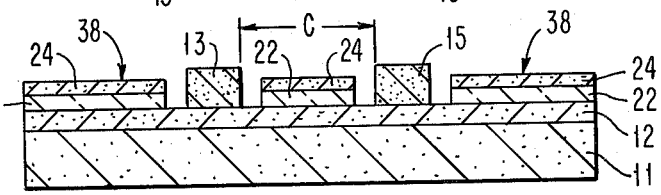

Doped Si is evaporated onto the photoresist 26 and the exposed epitaxial layer 32. The doped Si coats the photoresist with a layer of polysilicon 33 and forms a polysilicon source 13 and drain 15 as illustrated in FIG. 3C. When the epitaxial layer is an n type silicon it is appropriate to use silicon doped with phosphorous to a level of $10^{20}$ donors per cm$^3$. The evaporation can be accomplished by using an electron beam for heating and evaporating the silicon. The photoresist layer 26 and the overlying polysilicon layer 33 then can be removed employing a solvent such as acetone. This leaves doped mesas 13 and 15 which serve as a source 13 and drain 15 with the area between, C, being reserved for subsequent deposition of a gate as is illustrated in FIG. 3D. A second photoresist layer 36 is applied to the Si$_3$N$_4$ layer 24 as well as the doped mesas 13 and 15. This photoresist layer 36 has a thickness between about 5000 Å and 10,000 Å.

Figure 3E:
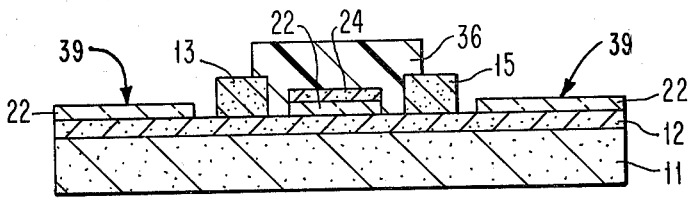
Figure 3F:
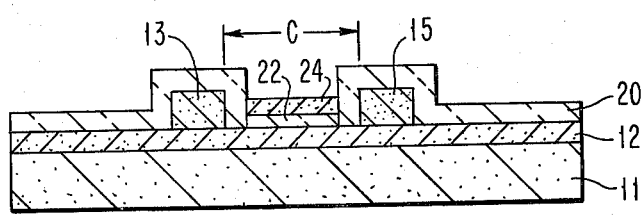
Figure 3G:
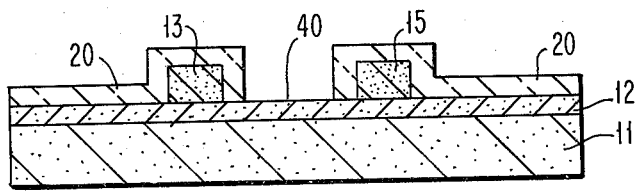

The second photoresist layer 36 is selectively exposed and developed to expose areas of the Si$_3$N$_4$ 24 and portions of the mesas 13 and 15 while leaving intact the second photoresist layer 36 on the Si$_3$N$_4$ film 24 which is over the area reserved for gates. The residual photoresist layer 36 is illustrated in FIG. 3E. The exposed Si$_3$N$_4$ areas 38 are then removed by etching. Typically, when the film is approximately 500 Å thick it can be removed by chemical etching preferably with H$_3$PO$_4$ at 180° C. for about five minutes. The remaining second photoresist layer 36 is then removed with a solvent such as acetone and the sample is ready for oxidation. Mesas 13 and 15 are thermally oxidized preferably in steam at about 1000° C. for several minutes so as to develop an oxide layer of approximately 2000 Å. During this time the oxide layers in the regions 39 will continue to thicken. The resulting structure is shown in FIG. 3F. The remaining portion of the Si$_3$N$_4$ film 24 which is over the gate area C, is removed by chemical etching, again preferably this may be accomplished by using an etch such as H$_3$PO$_4$ at 180° C. for about five minutes. The underlined SiO$_2$ layer 22 may be removed by etching with a HF acid solution which is buffered with NH$_4$F. This will expose a portion 40 of the epitaxial layer 12 onto which a metal may be deposited to form a gate.

When the metal is selected from the group of those metals known to form a Schottky barrier with Si such as Pt, Ti, or W, a Schottky barrier MESFET is formed. Metal silicides such as PdSi$_2$ or PtSi may be used as well.

Alternatively, a junction gate may be formed by a diffusive treatment of the exposed portion 40 of the substrate 12 with a P type dopant.

The diffusive treatment may be either thermal diffusion or ion implantation, the latter being preferred since it limits lateral movement of the dopant. The gate deposited should form an ohmic contact to the diffusion region. Aluminum is a satisfactory metal for the gate.

The gates may be patterned employing standard subtractive etch photoresist processes where the photoresist is applied and the areas of the photoresist above the gate area is exposed and developed. This again, exposes the portion 40 of the substrate on to which the metal is deposited.

Subsequently, a layer of aluminum of other suitable metallurgy can be evaporated and patterned to form source, drain, and gate contacts as well as interconnections.

While I have illustrated and described the preferred embodiments of my invention, it is to be understood that I do not limit myself to the practiced constructions herein disclosed and the right is reserved to all changes and modifications coming within the scope of the invention as defined in the appended claim.

Having thus described my invention, what I claim as new, and desire to secure by Letters Patent is:

1. A method of fabricating self-aligned MESFET devices including the steps of:

providing a semiconductor body having an epitaxial layer of opposite polarity deposited there on;

growing of said epitaxial layer a layer of SiO$_2$, said layer of SiO$_2$ being between about 100 Å to 1000 Å;

depositing onto said SiO$_2$ layer a layer of Si$_3$N$_4$, said layer of Si$_3$N$_4$ being between 200 Å and 1000 Å;

applying a first photoresist layer on said layer of Si$_3$N$_4$, the thickness of the photoresist being between about 5000 Å to 10,000 Å;

selectively exposing said first photoresist layer and developing to provide patterned opening exposing regions for sources and drains on said Si$_3$N$_4$ layer;

etching to remove said exposed Si$_3$N$_4$ regions for sources and drains;

continuing said etching to remove said SiO$_2$ layer beneath said exposed regions of said Si$_3$N$_4$ exposing regions of said epitaxial layer;

evaporating doped Si onto exposed regions of said epitaxial layer;

lifting off said unexposed first photoresist layer leaving doped mesas for sources and drains with the area therebetween being reserved for subsequent deposition of gates;

applying a second photoresist layer to said Si$_3$N$_4$ and said doped semiconductor mesas; thickness of said second photoresist layer thickness being between about 5000 Å and 10,000 Å;

selectively exposing said second photoresist layer and developing to expose areas of said Si$_3$N$_4$ and said mesas while leaving intact said second photoresist layer on the Si$_3$N$_4$ film which is over said areas reserved for said gates;

removing said exposed Si$_3$N$_4$ areas by etching;

lifting off said unexposed layer of said second photoresist;

oxidizing said mesas to form an oxide layer thereon of about 2000 Å;

etching said Si$_3$N$_4$ film over said areas reserved for gates;

etching said SiO$_2$ film from said region reserved for gates, exposing said epitaxial substrate;

forming gates by patterning onto said exposed substrate a metal.

2. The method of claim 1 wherein said layer of SiO$_2$ deposited on said epitaxial layer is about 250 Å, said layer of Si$_3$N$_4$ is about 500 Å.

3. The method of claim 2 wherein the development of said first photoresist layer results in undercut profiles.

4. The method of claim 3 wherein said etching of said Si$_3$N$_4$ regions for sources and drains and said SiO$_2$ layer beneath said exposed regions of said Si$_3$N$_4$ is reactive ion etching with the ions generated from mixtures of about 70% CF$_4$ and the balance H$_2$.

5. The method of claim 1 wherein said metal is from the group of Pt, Ti and W thereby forming a Schottky barrier.

6. The method of claim 1 further comprising the step of employing a diffusive treatment to said exposed substrate to form a junction therein before patterning said gates on said exposed substrate a metal.

7. The method of claim 6 wherein said diffusive treatment is ion implantation.

8. The method of claim 6 wherein said gates are Al.

* * * * *